(12) United States Patent
Koswatta et al.

(10) Patent No.: US 12,423,568 B2
(45) Date of Patent: Sep. 23, 2025

(54) COUNTER BASED RESISTIVE PROCESSING UNIT FOR PROGRAMMABLE AND RECONFIGURABLE ARTIFICIAL-NEURAL-NETWORKS

(71) Applicant: International Business Machines Corporation, Armonk, NY (US)

(72) Inventors: Siyuranga Koswatta, Carmel, NY (US); Yulong Li, Westchester, NY (US); Paul M. Solomon, Westchester, NY (US)

(73) Assignee: International Business Machines Corporation, Armonk, NY (US)

( * ) Notice: Subject to any disclaimer, the term of this patent is extended or adjusted under 35 U.S.C. 154(b) by 62 days.

(21) Appl. No.: 18/510,755

(22) Filed: Nov. 16, 2023

(65) Prior Publication Data

US 2024/0086697 A1    Mar. 14, 2024

Related U.S. Application Data

(62) Division of application No. 17/518,629, filed on Nov. 4, 2021, now Pat. No. 11,875,249, which is a division
(Continued)

(51) Int. Cl.
*G06N 20/00*        (2019.01)
*G06N 3/04*         (2023.01)
(Continued)

(52) U.S. Cl.
CPC .............. *G06N 3/065* (2023.01); *G06N 3/08* (2013.01); *H03K 19/20* (2013.01)

(58) Field of Classification Search
CPC .......... G06N 3/065; G06N 3/08; G06N 3/084; H03K 19/20
See application file for complete search history.

(56) References Cited

U.S. PATENT DOCUMENTS 2,715,656 A    8/1955  Andrews, Jr.
5,202,956 A    4/1993  Mashiko
(Continued)

FOREIGN PATENT DOCUMENTS

CN    106158017 A    11/2016
JP    H02236659 A     9/1990
(Continued)

OTHER PUBLICATIONS

Chi et al., "Processing-in-Memory in ReRAM-based Main Memory," SEAL-lab Technical Report—No. 2015-001, Apr. 29, 2016, pp. 1-12.
(Continued)

*Primary Examiner* — Brandon S Cole
(74) *Attorney, Agent, or Firm* — CANTOR COLBURN LLP; Daniel Yeates

(57) ABSTRACT

Technical solutions are described for storing weight in a crosspoint device of a resistive processing unit (RPU) array. An example system includes a crosspoint array, wherein each array node represents a connection between neurons of the neural network, and wherein each node stores a weight assigned to the node. The crosspoint array includes a crosspoint device at each node. The crosspoint device includes a counter that has multiple single bit counters, and states of the counters represent the weight to be stored at the crosspoint device. Further, the crosspoint device includes a resistor device that has multiple resistive circuits, and each resistive circuit is associated with a respective counter from the counters. The resistive circuits are activated or deactivated according to a state of the associated counter, and an electrical conductance of the resistor device is adjusted based at least in part on the resistive circuits that are activated.

8 Claims, 15 Drawing Sheets

Related U.S. Application Data of application No. 15/840,322, filed on Dec. 13, 2017, now Pat. No. 11,222,259.

(51) Int. Cl.
*G06N 3/049* (2023.01)
*G06N 3/065* (2023.01)
*G06N 3/08* (2023.01)
*G06N 3/082* (2023.01)
*H03K 19/20* (2006.01)

(56) References Cited

U.S. PATENT DOCUMENTS

| | | | |
|---|---|---|---|
| 5,293,457 | A | 3/1994 | Arima |
| 5,396,581 | A | 3/1995 | Mashiko |
| 6,256,247 | B1 | 7/2001 | Perner |
| 6,876,989 | B2 | 4/2005 | Shi et al. |
| 8,009,455 | B2 | 8/2011 | Lowrey et al. |
| 8,542,521 | B2 | 9/2013 | Hamada |
| 9,412,446 | B1 | 8/2016 | Lohn et al. |
| 9,466,362 | B2 | 10/2016 | Yu et al. |
| 9,646,243 | B1 | 5/2017 | Gokmen |
| 9,659,249 | B1 | 5/2017 | Copel |
| 9,715,656 | B1 | 7/2017 | Gokmen |
| 9,779,355 | B1 | 10/2017 | Leobandung |
| 9,812,196 | B2 | 11/2017 | Perner |
| 10,127,494 | B1 | 11/2018 | Cantin et al. |
| 10,482,929 | B2 * | 11/2019 | Li .................. G06N 3/065 |
| 11,222,259 | B2 | 1/2022 | Koswatta et al. |
| 2005/0078536 | A1 | 4/2005 | Perner et al. |
| 2005/0083748 | A1 | 4/2005 | Lemus et al. |
| 2005/0102576 | A1 | 5/2005 | Perner et al. |
| 2008/0212382 | A1 * | 9/2008 | Mouttet ............ H03K 19/177 365/189.15 |
| 2011/0119215 | A1 * | 5/2011 | Elmegreen ........ G06N 3/065 706/37 |
| 2012/0173471 | A1 | 7/2012 | Ananthanarayanan et al. |
| 2012/0259804 | A1 | 10/2012 | Brezzo et al. |
| 2013/0325775 | A1 | 12/2013 | Sinyavskiy et al. |
| 2014/0114893 | A1 | 4/2014 | Arthur et al. |
| 2015/0255157 | A1 | 9/2015 | Ikeda et al. |
| 2015/0278682 | A1 | 10/2015 | Saxena |
| 2016/0049195 | A1 | 2/2016 | Yu et al. |
| 2016/0336064 | A1 * | 11/2016 | Seo ................... G11C 13/0002 |
| 2017/0040054 | A1 | 2/2017 | Friedman et al. |
| 2017/0091621 | A1 | 3/2017 | Gokmen et al. |
| 2017/0109626 | A1 | 4/2017 | Gokmen et al. |
| 2017/0124025 | A1 | 5/2017 | Gokmen |
| 2017/0243108 | A1 | 8/2017 | Ritter et al. |
| 2019/0180174 | A1 | 6/2019 | Koswatta et al. |
| 2019/0325291 | A1 * | 10/2019 | Gokmen ............. G06N 3/045 |
| 2022/0058474 | A1 | 2/2022 | Koswatta et al. |

FOREIGN PATENT DOCUMENTS

| | | |
|---|---|---|
| JP | H0380379 A | 4/1991 |
| JP | H03223982 A | 10/1991 |
| JP | H06215163 A | 8/1994 |
| JP | H0884078 A | 3/1996 |
| WO | 2009142828 A1 | 11/2009 |
| WO | 2017136100 A1 | 8/2017 |
| WO | 2017155544 A1 | 9/2017 |

OTHER PUBLICATIONS

Chinese Office Action; Application No. 201880077961.9; Date of mailing: Apr. 22, 2023; 9 pages.
Chinese Office Action; Application No. 201880077961.9; Date of mailing: Aug. 25, 2023; 6 pages.
German Office Action; Application No. 112018005726.7; Filing Date: May 28, 2020; Date of mailing: Dec. 21, 2021; 4 pages.
Gokmen et al., "Acceleration of Deep Neural Network Training with Resistive Cross Point Devices: Design Considerations," Frontiers in Neuroscience, DOI: 10.3389/fnins.2016.00333, Jul. 21, 2016, pp. 1-13.
Japanese Office Action; Application No. 2020-531461; Date of Drafting: Jun. 16, 2022; 7 pages.
Kim et al., "Analog CMOS-based Resistive Processing Unit for Deep Neural Network Training," IEEE 60th International Midwest Symposium on Circuits and Systems (MWSCAS), Aug. 6-9, 2017, 4 pages.
List of IBM Patents or Patent Applications Treated as Related (Appendix P); Date Filed: Nov. 16, 2023; 2 pages.

* cited by examiner f(x) = f (INPUT 1 * CONNECTION STRENGTH 1 + INPUT 2 * CONNECTION STRENGTH 2)

COUNTER BASED RESISTIVE PROCESSING UNIT FOR PROGRAMMABLE AND RECONFIGURABLE ARTIFICIAL-NEURAL-NETWORKS

BACKGROUND

The present invention relates in general to configurations of trainable resistive crosspoint devices, which are referred to herein as resistive processing units (RPUs). More specifically, the present invention relates to artificial neural networks (ANNs) formed from crossbar arrays of resistive processing units (RPUs) that provide local data storage and local data processing without the need for additional processing elements beyond the RPU, thereby accelerating the ANN's ability to implement algorithms such as matrix inversion, matrix decomposition and the like.

Technical problems such as character recognition and image recognition by a computer are known to be well handled by machine-learning techniques. "Machine learning" is used to broadly describe a primary function of electronic systems that learn from data. In machine learning and cognitive science, ANNs are a family of statistical learning models inspired by the biological neural networks of animals, and in particular, the brain. ANNs can be used to estimate or approximate systems and functions that depend on a large number of inputs and are generally unknown. Crossbar arrays are high density, low cost circuit architectures used to form a variety of electronic circuits and devices, including ANN architectures, neuromorphic microchips, and ultra-high density nonvolatile memory. A basic crossbar array configuration includes a set of conductive row wires and a set of conductive column wires formed to intersect the set of conductive row wires. The intersections between the two sets of wires are separated by so-called crosspoint devices.

SUMMARY

According to one or more embodiments of the present invention, a system for implementing a neural network is described. The system includes a crosspoint array that includes multiple nodes, wherein each node represents a connection between neurons of the neural network, and wherein each node stores a weight assigned to the node. The crosspoint array includes a crosspoint device at each node. The crosspoint device includes a counter that has multiple single bit counters, and states of the single bit counters represent the weight to be stored at the crosspoint device. Further, the crosspoint device includes a resistor device that has multiple resistive circuits, and each resistive circuit is associated with a respective single bit counter from the single bit counters. The resistive circuits are activated or deactivated according to a state of the associated single bit counter, and an electrical conductance of the resistor device is adjusted based at least in part on the resistive circuits that are activated. Further, a global controller adjusts values stored at each crosspoint device in the crosspoint array.

According to one or more embodiments of the present invention, a crosspoint array for implementing a neural network is described. An example crosspoint array includes a set of crosspoint devices, a crosspoint device at a respective node of the crosspoint array, each node representing a connection between neurons of the neural network, and each node storing a weight assigned to the node. The crosspoint device includes a counter that has a set of single bit counters, and states of the single bit counters represent the weight to be stored at the crosspoint device. A resistor device includes a set of resistive circuits, and each resistive circuit is associated with a respective single bit counter from the set of single bit counters. The resistive circuits are activated or deactivated according to a state of the associated single bit counter, and an electrical conductance of the resistor device is adjusted based at least in part on the resistive circuits that are activated.

According to one or more embodiments of the present invention, a method for implementing a neural network includes selecting, by a global controller, a matrix to be loaded in a crosspoint array, wherein the matrix corresponds to a connection between two layers of the neural network. The method further includes loading, by a local controller at a crosspoint in the crosspoint array, a weight value in a crosspoint device that is associated with the crosspoint, the weight value is assigned to the crosspoint for the selected matrix. Further, the method includes adjusting, by the crosspoint device, a conductance of a resistor device associated with the crosspoint, wherein the conductance corresponds to the weight value loaded into the crosspoint device.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The examples described throughout the present document will be better understood with reference to the following drawings and description. The components in the figures are not necessarily to scale. Moreover, in the figures, like-referenced numerals designate corresponding parts throughout the different views.

Figure 1:
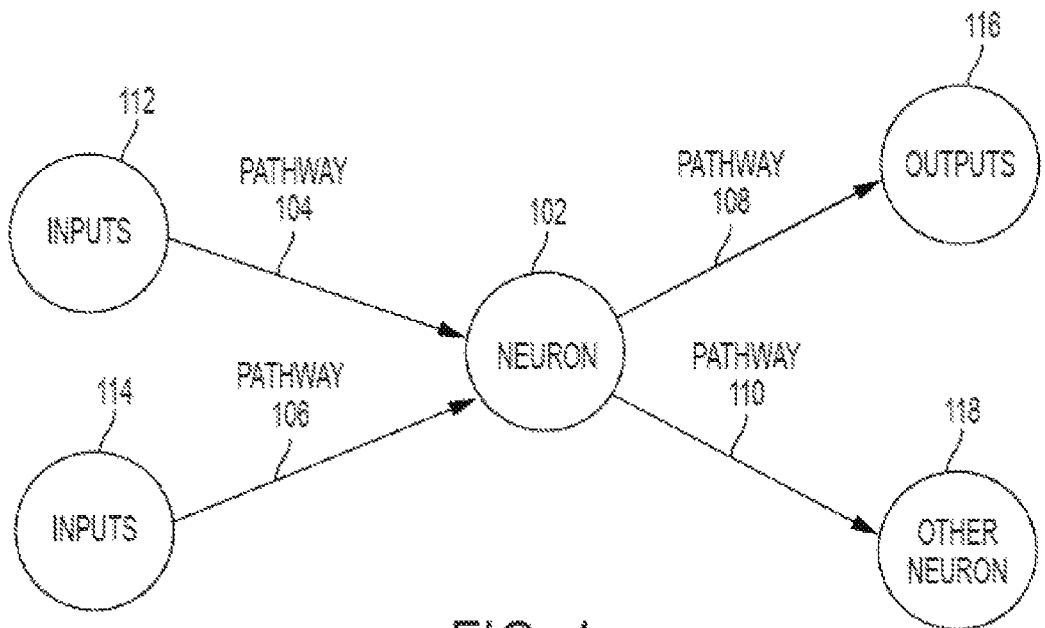
FIG. 1 depicts a simplified diagram of input and output connections of a biological neuron.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

DETAILED DESCRIPTION

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" can be understood to include any integer number greater than or equal to one, i.e., one, two, three, four, etc. The terms "a plurality" can be understood to include any integer number greater than or equal to two, i.e., two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

It is understood in advance that although one or more embodiments are described in the context of biological neural networks with a specific emphasis on modeling brain structures and functions, implementation of the teachings recited herein are not limited to modeling a particular environment. Rather, embodiments of the present invention are capable of modeling any type of environment, including, for example, weather patterns, arbitrary data collected from the internet, and the like, as long as the various inputs to the environment can be turned into a vector.

Artificial neural networks (ANNs) can be used to estimate or approximate systems and functions that depend on a large number of inputs and are generally unknown. Neural networks use a class of algorithms based on a concept of interconnected "neurons." In a typical neural network, neurons have a given activation function that operates on the inputs. By determining proper connection weights (a process also referred to as "training"), a neural network achieves efficient recognition of desired patterns, such as images and characters. Oftentimes, these neurons are grouped into "layers" in order to make connections between groups more obvious and to each computation of values. Training the neural network is a computationally intense process.

ANNs are often embodied as so-called "neuromorphic" systems of interconnected processor elements that act as simulated "neurons" and exchange "messages" between each other in the form of electronic signals. Similar to the so-called "plasticity" of synaptic neurotransmitter connections that carry messages between biological neurons, the connections in ANNs that carry electronic messages between simulated neurons are provided with numeric weights that correspond to the strength or weakness of a given connection. The weights can be adjusted and tuned based on experience, making ANNs adaptive to inputs and capable of learning. For example, an ANN for handwriting recognition is defined by a set of input neurons, which can be activated by the pixels of an input image. After being weighted and transformed by a function determined by the network's designer, the activations of these input neurons are then passed to other downstream neurons, which are often referred to as "hidden" neurons. This process is repeated until an output neuron is activated. The activated output neuron determines which character was read.

Crossbar arrays, also known as crosspoint arrays or cross-wire arrays, are high density, low cost circuit architectures used to form a variety of electronic circuits and devices, including ANN architectures, neuromorphic microchips, and ultra-high density nonvolatile memory. A basic crossbar array configuration includes a set of conductive row wires and a set of conductive column wires formed to intersect the set of conductive row wires. The intersections between the two sets of wires are separated by so-called crosspoint devices, which can be formed from thin film material.

Crosspoint devices, in effect, function as the ANN's weighted connections between neurons. Nanoscale devices, for example, memristors having "ideal" conduction state switching characteristics, are often used as the crosspoint devices in order to emulate synaptic plasticity with high energy efficiency. The conduction state (e.g., resistance) of the ideal memristor material can be altered by controlling the voltages applied between individual wires of the row and column wires. Digital data can be stored by alteration of the memristor material's conduction state at the intersection to achieve a high conduction state or a low conduction state. The memristor material can also be programmed to maintain two or more distinct conduction states by selectively setting the conduction state of the material. The conduction state of the memristor material can be read by applying a voltage across the material and measuring the current that passes through the target crosspoint device. So far, however, there have been some practical drawbacks in memristor and other resistive-random-access-memory (RRAM) based crosspoint devices that are detrimental to ANN applications; significant device-to-device variability and the asymmetry between "set (i.e., to increment resistance)" and "reset (i.e., to decrement resistance)" operations are two such main limitations.

In order to limit power consumption, the crosspoint devices of ANN chip architectures are often designed to utilize offline learning techniques, wherein the approximation of the target function does not change once the initial training phase has been resolved. Offline learning allows the crosspoint devices of crossbar-type ANN architectures to be simplified such that they draw very little power.

Notwithstanding the potential for lower power consumption, executing offline training can be difficult and resource intensive because it is typically necessary during training to modify a significant number of adjustable parameters (e.g., weights) in the ANN model to match the input-output pairs for the training data. Accordingly, simplifying the crosspoint devices of ANN architectures to prioritize power-saving, offline learning techniques typically means that training speed and training efficiency are not optimized.

Providing simple crosspoint devices that keep power consumption within an acceptable range, as well as accelerate the speed and efficiency of training ANN architectures, would improve overall ANN performance and allow a broader range of ANN applications. Accordingly, described herein are technical solutions that facilitate using and training crosspoint arrays using counter-based crosspoint devices that can provide adjustable conductance (resistance) representing corresponding weights to be stored in the array. Further, comparing to typical capacitor-based implementations for weight storage, the technical solutions described herein address technical challenges such as charge-loss, and stringent requirements on update currents. Also, unlike memristor or RRAM-based crosspoint devices, the counter-based crosspoint device has lesser device-to-device variability (afforded by well-established semiconductor technological processes) and ideal symmetry between up-counting vs. down-counting of the weight values.

The technical solutions described herein further facilitate updating the values stored by the counter-based crosspoint devices based at least in part on specific clock events. The clock events facilitate the crosspoint array that represents a neural network to update the stored weights after forward and/or a back propagation. The stored weight is then used during subsequent forward and/or back propagation.

The use of counter-based crosspoint devices as the RPUs in the RPU array facilitates the RPU array to have the robustness of conventional CMOS technology. Further, the use of digital counters facilitates symmetry between up vs. down weight increments. Further yet, the counter-based crosspoint devices facilitate the RPU array to work with stochastic parallel update algorithms for back propagation.

In one or more examples, weight elements are stored in digital counters (e.g., J-K flip-flop-based counters) of the crosspoint devices. Each bit in the counter is associated with one or more resistive circuit from a stack of resistive circuits of the crosspoint devices. The counter bits control the gate terminals of FETs connected in a series such that the total resistance of the FET stack will be used as the transduction element (i.e., resistor element of each RPU cell). Thus, the counter bits facilitate controlling a total resistance of the stack of resistive circuits, as described in detail further.

Although embodiments of the present invention are directed to electronic systems, for ease of reference and explanation, various aspects of the electronic systems are described using neurological terminology such as neurons, plasticity, and synapses, for example. It will be understood that for any discussion or illustration herein of an electronic system, the use of neurological terminology or neurological shorthand notations are for ease of reference and are meant to cover the neuromorphic, ANN equivalent(s) of the described neurological function or neurological component.

Instead of utilizing the traditional digital model of manipulating zeros and ones, ANNs create connections between processing elements that are substantially the functional equivalent of the core system functionality that is being estimated or approximated. For example, IBM™'s SyNapse™ computer chip is the central component of an electronic neuromorphic machine that attempts to provide similar form, function, and architecture to the mammalian brain. Although the IBM SyNapse computer chip uses the same basic transistor components as conventional computer chips, its transistors are configured to mimic the behavior of neurons and their synapse connections. The IBM SyNapse computer chip processes information using a network of just over one million simulated "neurons," which communicate with one another using electrical spikes similar to the synaptic communications between biological neurons. The IBM SyNapse architecture includes a configuration of processors (i.e., simulated "neurons") that read a memory (i.e., a simulated "synapse") and perform simple operations. The communications between these processors, which are typically located in different cores, are performed by on-chip network routers.

Figure 2:
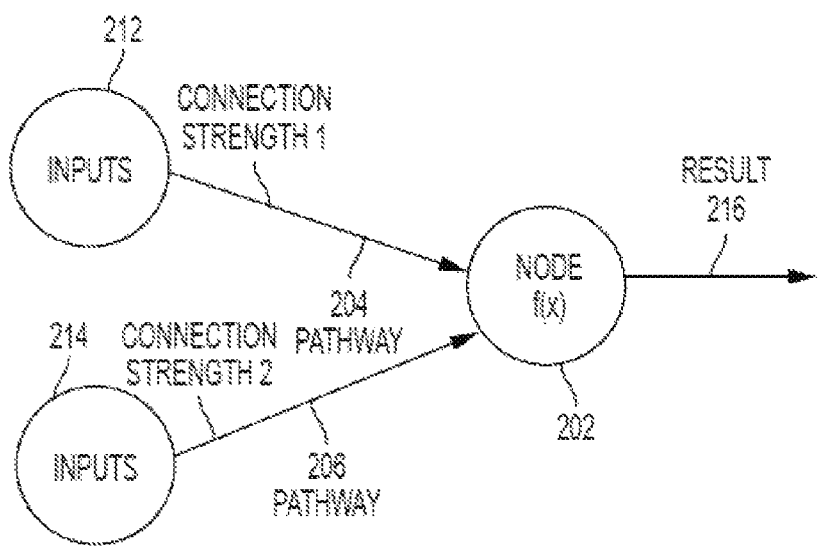
FIG. 2 depicts a known simplified model of the biological neuron shown in FIG. 1.
Figure 3:
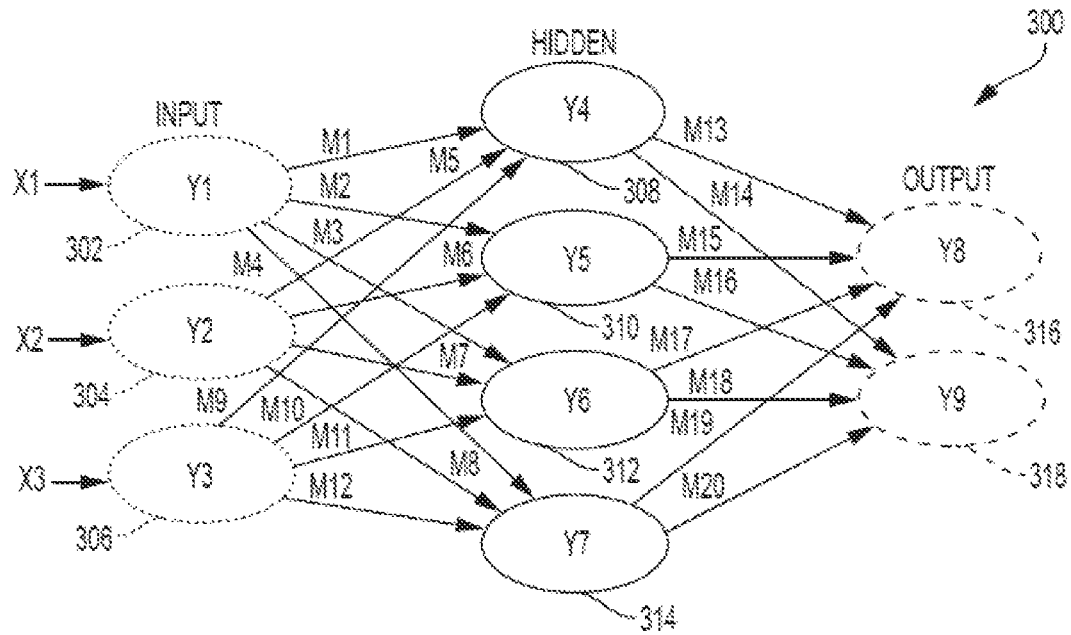
FIG. 3 depicts a known simplified model of an ANN incorporating the biological neuron model shown in FIG. 2.

A general description of how a typical ANN operates will now be provided with reference to FIGS. 1, 2, and 3. As previously noted herein, a typical ANN models the human brain, which includes about one hundred billion interconnected cells called neurons. FIG. 1 depicts a simplified diagram of a biological neuron 102 having pathways 104, 106, 108, 110 that connect it to upstream inputs 112, 114, downstream outputs 116, and downstream "other" neurons 118, configured and arranged as shown. Each biological neuron 102 sends and receives electrical impulses through pathways 104, 106, 108, 110. The nature of these electrical impulses and how they are processed in biological neuron 102 are primarily responsible for overall brain functionality. The pathway connections between biological neurons can be strong or weak. When a given neuron receives input impulses, the neuron processes the input according to the neuron's function and sends the result of the function to downstream outputs and/or downstream "other" neurons.

Biological neuron 102 is modeled in FIG. 2 as a node 202 having a mathematical function, f(x) depicted by the equation shown in FIG. 2. Node 202 takes electrical signals from inputs 212, 214, multiplies each input 212, 214 by the strength of its respective connection pathway 204, 206, takes a sum of the inputs, passes the sum through a function, f(x), and generates a result 216, which can be a final output or an input to another node, or both. In the present description, an asterisk (*) is used to represent a multiplication. Weak input signals are multiplied by a very small connection strength number, so the impact of a weak input signal on the function is very low. Similarly, strong input signals are multiplied by a higher connection strength number, so the impact of a strong input signal on the function is larger. The function f(x) is a design choice, and a variety of functions can be used. An example design choice for f(x) is the hyperbolic tangent function, which takes the function of the previous sum and outputs a number between minus one and plus one.

FIG. 3 depicts a simplified ANN model 300 organized as a weighted directional graph, wherein the artificial neurons are nodes (e.g., 302, 308, 316), and wherein weighted directed edges (e.g., m1 to m20) connect the nodes. ANN model 300 is organized such that nodes 302, 304, 306 are input layer nodes, nodes 308, 310, 312, 314 are hidden layer nodes and nodes 316, 318 are output layer nodes. Each node is connected to every node in the adjacent layer by connection pathways, which are depicted in FIG. 3 as directional arrows having connection strengths m1 to m20. Although only one input layer, one hidden layer, and one output layer are shown, in practice, multiple input layers, hidden layers, and output layers can be provided.

Similar to the functionality of a human brain, each input layer node 302, 304, 306 of ANN 300 receives inputs x1, x2, x3 directly from a source (not shown) with no connection strength adjustments and no node summations. Accordingly, y1=f(x1), y2=f(x2) and y3=f(x3), as shown by the equations listed at the bottom of FIG. 3. Each hidden layer node 308, 310, 312, 314 receives its inputs from all input layer nodes 302, 304, 306 according to the connection strengths associated with the relevant connection pathways. Thus, in hidden layer node 308, y4=f(m1*y1+m5*y2+m9*y3), wherein * represents a multiplication. A similar connection strength multiplication and node summation is performed for hidden layer nodes 310, 312, 314 and output layer nodes 316, 318, as shown by the equations defining functions y5 to y9 depicted at the bottom of FIG. 3.

ANN model 300 processes data records one at a time, and it "learns" by comparing an initially arbitrary classification of the record with the known actual classification of the record. Using a training methodology knows as "back propagation" (i.e., "backward propagation of errors"), the errors from the initial classification of the first record are fed back into the network and used to modify the network's weighted connections the second time around, and this feedback process continues for many iterations. In the training phase of an ANN, the correct classification for each record is known, and the output nodes can therefore be assigned "correct" values. For example, a node value of "1" (or 0.9) for the node corresponding to the correct class, and a node value of "0" (or 0.1) for the others. It is thus possible to compare the network's calculated values for the output nodes to these "correct" values, and to calculate an error term for each node (i.e., the "delta" rule). These error terms are then used to adjust the weights in the hidden layers so that in the next iteration, the output values will be closer to the "correct" values.

There are many types of neural networks, but the two broadest categories are feed-forward and feedback/recurrent networks. ANN model 300 is a non-recurrent feed-forward network having inputs, outputs, and hidden layers. The signals can only travel in one direction. Input data is passed onto a layer of processing elements that perform calculations. Each processing element makes its computation based upon a weighted sum of its inputs. The new calculated values then become the new input values that feed the next layer. This process continues until it has gone through all the layers and determined the output. A threshold transfer function is sometimes used to quantify the output of a neuron in the output layer.

A feedback/recurrent network includes feedback paths, which means that the signals can travel in both directions using loops. All possible connections between nodes are allowed. Because loops are present in this type of network, under certain operations, it can become a non-linear dynamical system that changes continuously until it reaches a state of equilibrium. Feedback networks are often used in associative memories and optimization problems, wherein the network looks for the best arrangement of interconnected factors.

The speed and efficiency of machine learning in feed-forward and recurrent ANN architectures depend on how effectively the crosspoint devices of the ANN crossbar array perform the core operations of typical machine learning algorithms. Although a precise definition of machine learning is difficult to formulate, a learning process in the ANN context can be viewed as the problem of updating the crosspoint device connection weights so that a network can efficiently perform a specific task. The crosspoint devices typically learn the necessary connection weights from available training patterns. Performance is improved over time by iteratively updating the weights in the network. Instead of following a set of rules specified by human experts, ANNs "learn" underlying rules (like input-output relationships) from the given collection of representative examples. Accordingly, a learning algorithm can be generally defined as the procedure by which learning rules are used to update and/or adjust the relevant weights.

The three main learning algorithm paradigms are supervised, unsupervised and hybrid. In supervised learning, or learning with a "teacher," the network is provided with a correct answer (output) for every input pattern. Weights are determined to allow the network to produce answers as close as possible to the known correct answers. Reinforcement learning is a variant of supervised learning in which the network is provided with only a critique on the correctness of network outputs, not the correct answers themselves. In contrast, unsupervised learning, or learning without a teacher, does not require a correct answer associated with each input pattern in the training data set. It explores the underlying structure in the data, or correlations between patterns in the data, and organizes patterns into categories from these correlations. Hybrid learning combines supervised and unsupervised learning. Parts of the weights are usually determined through supervised learning, while the others are obtained through unsupervised learning.

As previously noted herein, in order to limit power consumption, the crosspoint devices of ANN chip architectures are often designed to utilize offline learning techniques, wherein the approximation of the target function does not change once the initial training phase has been resolved. Offline learning allows the crosspoint devices of crossbar-type ANN architectures to be simplified such that they draw very little power.

Figure 4:
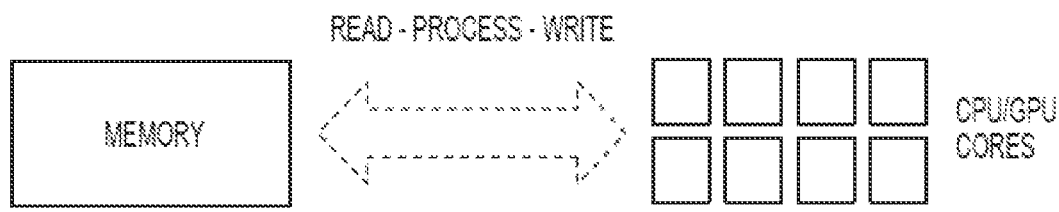
FIG. 4 depicts a simplified block diagram of a known weight update methodology.

Notwithstanding the potential for lower power consumption, executing offline training can be difficult and resource intensive because it is typically necessary during training to modify a significant number of adjustable parameters (e.g., weights) in the ANN model to match the input-output pairs for the training data. FIG. 4 depicts a simplified illustration of a typical read-process-write weight update operation, wherein CPU/GPU cores (i.e., simulated "neurons") read a memory (i.e., a simulated "synapse") and perform weight update processing operations, then write the updated weights back to memory. Accordingly, simplifying the crosspoint devices of ANN architectures to prioritize power-saving, offline learning techniques typically means that training speed and training efficiency are not optimized.

Figure 5:
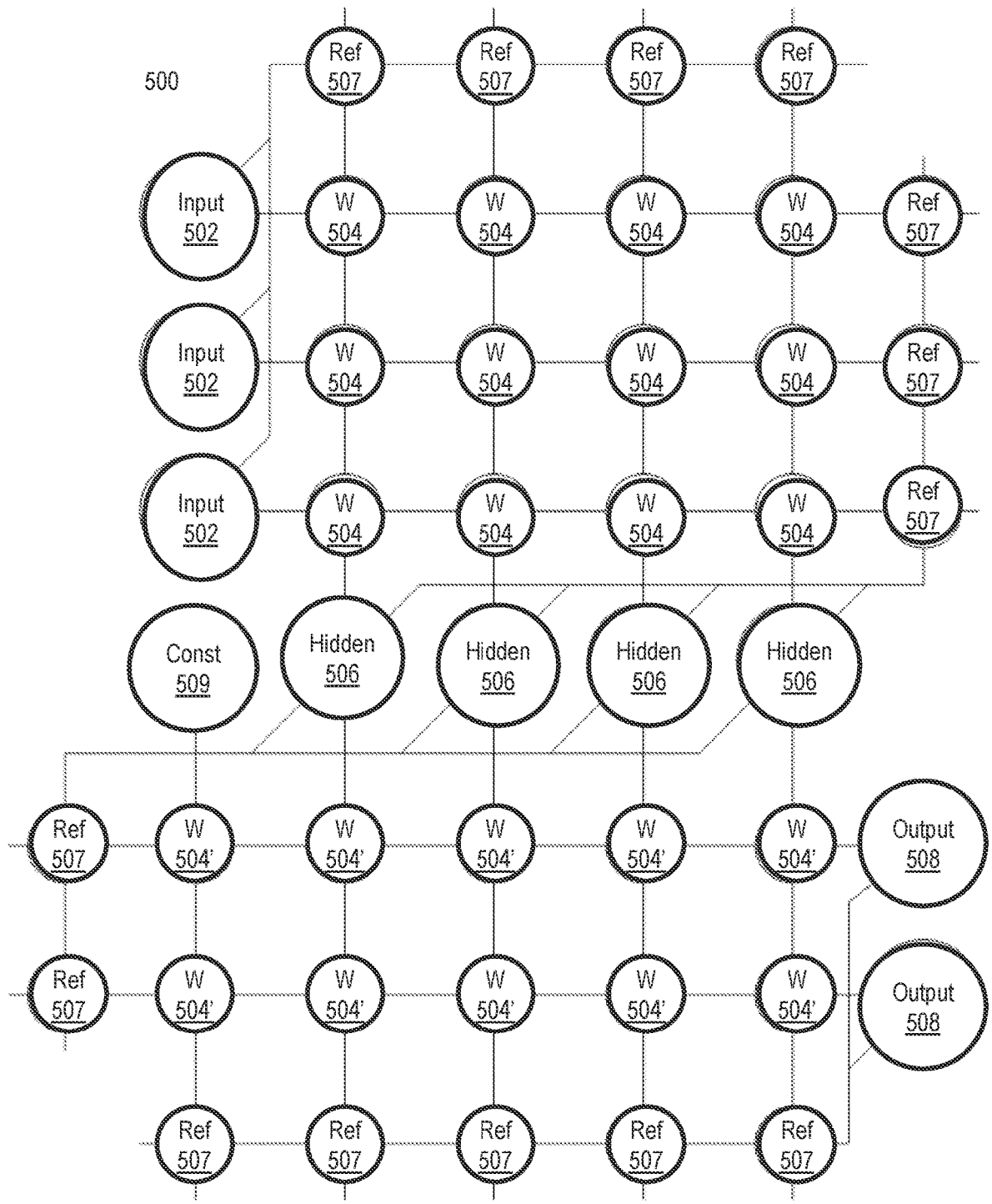
FIG. 5 is a diagram of an ANN including arrays of weights in accordance with the one or more embodiments.

FIG. 5 illustrates an artificial neural network (ANN) architecture 500. During feed-forward operation, a set of input neurons 502 each provide an input voltage in parallel to a respective row of weights 504. A weight 504 is a crosspoint device, such as an RPU device which is a counter-based weight element described herein. The weights 504 each have a settable resistance value, such that a current output flows from the weight 504 to a respective hidden neuron 506 to represent the weighted input. The current output by a given weight is determined as $$I = \frac{V}{r},$$

where V is the input voltage from the input neuron 502 and r is the set resistance of the weight 504. The current from each weight adds column-wise and flows to a hidden neuron 506.

The hidden neurons 506 use the currents from the array of weights 504 to perform some calculation. The hidden neurons 506 then output a voltage of their own to another array of weights 504'. This array performs in the same way, with a column of weights 504' receiving a voltage from their respective hidden neuron 506 to produce a weighted current output that adds row-wise and is provided to the output neuron 508.

It should be understood that any number of these stages can be implemented by interposing additional layers of arrays and hidden neurons 506.

During back propagation, the output neurons 508 provide a voltage back across the array of weights 504'. The output layer compares the generated network response to training data and computes an error. The error is applied to the array as a voltage pulse, where the height and/or duration of the pulse is modulated proportional to the error value. In this example, a row of weights 504' receives a voltage from a respective output neuron 508 in parallel and converts that voltage into a current, which adds column-wise to provide an input to hidden neurons 506. The hidden neurons 506 combine the weighted feedback signal with a derivative of its feed-forward calculation and store an error value before outputting a feedback signal voltage to its respective column of weights 504. It should be noted that the weights 504' operate in the same manner as the weights 504; the labeling is provided to indicate that weights 504 are between layers of neurons 502 and neurons 506, and weights 504' are between layers of neurons 506 and 508. This back propagation travels through the entire network 500 until all hidden neurons 506 and the input neurons 502 have stored an error value.

During weight updates, the input neurons 502 and hidden neurons 506 apply first weight update voltages to the crosspoint array of weights 504 and the output neurons 508 and hidden neurons 506 apply second weight update voltages to the crosspoint array of weights 504' through the network 500. Further, during the update phase of the weights 504, the input layer 502 applies voltage pulses (row-wise) proportional to the input values, and the layer 506 applies voltage pulses proportional to the error values of the hidden layer 506 (column-wise). Further yet, during the update phase of the neurons 504', hidden layer 506 applies voltage pulses proportional to its feed-forward output values (column-wise), and the output layer 508 applies voltage pulses proportional to the error of the output layer 508 (row-wise). The combinations of these voltages create a state change within each weight 504, 504', causing the weight 504, 504' to take on a new counter-value, which in turn changes the resistance value. In this manner, the weights 504, 504' can be trained to adapt the neural network 500 to errors in its processing. It should be noted that the three modes of operation, feed forward, back propagation, and weight update, do not overlap with one another.

Turning now to an overview of the present invention, one or more embodiments are directed to a programmable resistive crosspoint component referred to herein as a crosspoint device, or a resistive processing unit (RPU), which provides local data storage functionality and local data processing functionality. In other words, when performing data processing, the value stored at each RPU is updated in parallel and locally, which eliminates the need to move relevant data in and out of a processor and a separate storage element. Additionally, the local data storage and local data processing provided by the described RPUs accelerate the ANN's ability to implement algorithms such as matrix inversion, matrix decomposition, and the like. Accordingly, implementing a machine learning ANN architecture having the described RPU enables the implementation that optimizes the speed, efficiency, and power consumption of the ANN. The described RPU and resulting ANN architecture improve overall ANN performance and enable a broader range of practical ANN applications.

The described RPU can be implemented as resistive crosspoint devices, including a counter and a resistor device that includes a stack of resistive circuits. The counter includes digital circuits to store and output each bit in the counter. Each bit is associated with a respective resistive circuit from the stack of resistive circuits. Each resistive circuit provides a corresponding predetermined conductance (or resistance). In one or more examples, the conductance values of the resistive circuits from the stack in the resistor device have a predetermined relationship, such as a quadratic relationship. Based at least in part on a state of the bit (ON=1, OFF=0), the corresponding resistive circuit adds its corresponding conductance to the total conductance of the resistor device. Accordingly, based at least in part on the value stored in the counter, the conductance/resistance of the resistor device can be controlled.

Figure 6:
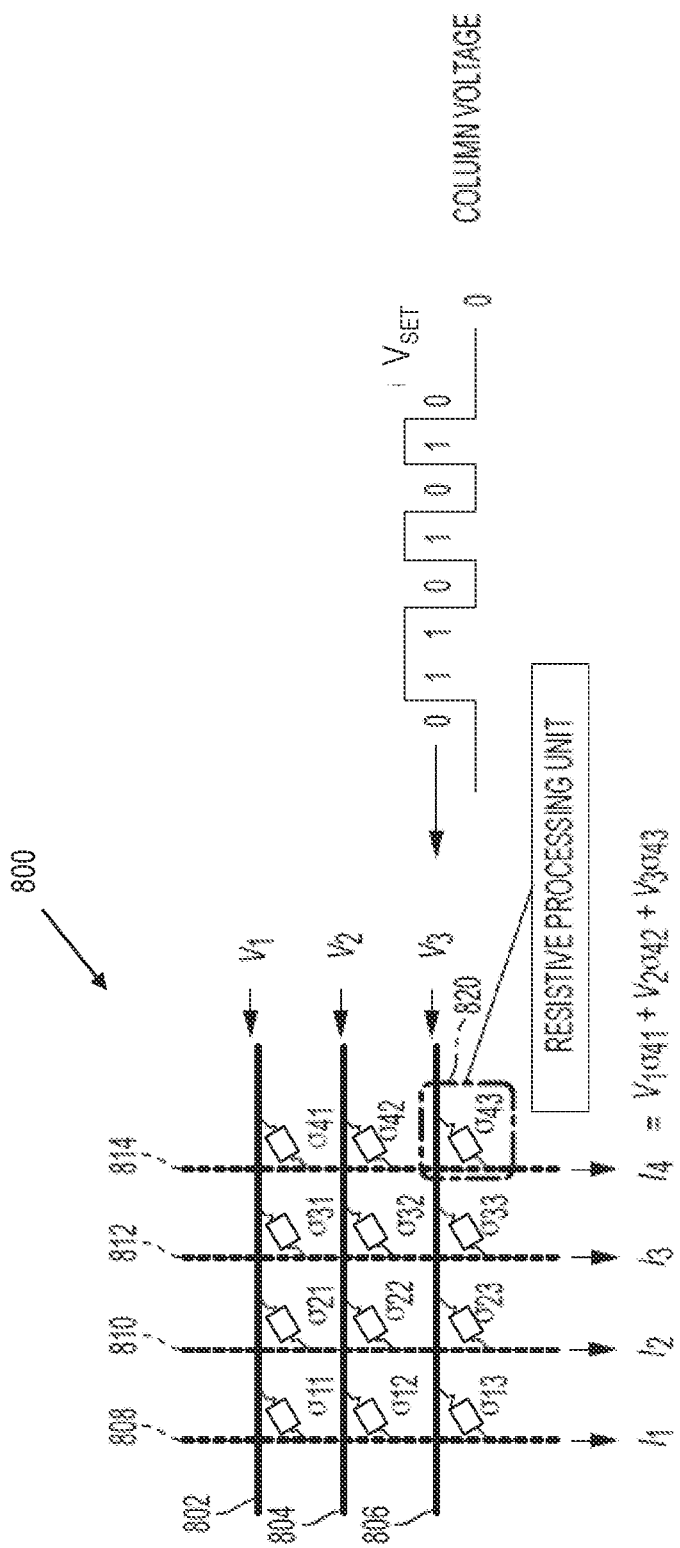
FIG. 6 depicts a crossbar array of RPU devices according to embodiments of the present invention, along with voltage sequences illustrating the operation of the RPU.

FIG. 6 depicts a crossbar array of two-terminal, non-linear RPU devices according to embodiments of the present invention, along with voltage sequences illustrating the operation of the RPU. FIG. 6 is a diagram of a two-dimensional (2D) crossbar array 800 that performs forward matrix multiplication, backward matrix multiplication, and weight updates according to embodiments of the present invention. Crossbar array 800 is formed from a set of conductive row wires 802, 804, 806, and a set of conductive column wires 808, 810, 812, and 814 that intersect the set of conductive row wires 802, 804, and 806. The intersections between the set of row wires and the set of column wires are separated by RPUs, which are shown in FIG. 6 as resistive elements each having its own adjustable/updateable resistive weight, depicted as $\sigma_{11}$, $\sigma_{21}$, $\sigma_{31}$, $\sigma_{41}$, $\sigma_{12}$, $\sigma_{22}$, $\sigma_{32}$, $\sigma_{42}$, $\sigma_{13}$, $\sigma_{23}$, $\sigma_{33}$, and $\sigma_{43}$, respectively. For ease of illustration, only one RPU 820 is labeled with a reference number in FIG. 6. In forward matrix multiplication, the conduction state (i.e., the stored weights) of the RPU can be read by applying a voltage across the RPU and measuring the current that passes through the RPU. In one or more examples, the crossbar array 800 includes two sets of conductive wires, that is two sets of rows and two sets of columns. In other words, each of 802, 804, 806, 808, 810, 812, and 814 includes two conductive wires. The forward/backward propagation happen through the first set of wires and the update happens through the second set of wires.

Input voltages $V_1$, $V_2$, $V_3$ are applied to row wires 802, 804, 806, respectively. Each column wire 808, 810, 812, 814 sums the currents $I_1$, $I_2$, $I_3$, $I_4$ generated by each RPU along the particular column wire. For example, as shown in FIG. 6, the current $I_4$ generated by column wire 814 is according to the equation $I_4 = V_1\sigma_{41} + V_2\sigma_{42} + V_3\sigma_{43}$. Thus, array 800 computes the forward matrix multiplication by multiplying the values stored in the RPUs by the row wire inputs, which are defined by voltages $V_1$, $V_2$, $V_3$, and accumulating the current values at each column. The backward matrix multiplication (not shown) is very similar. In backward matrix multiplication, voltages are applied at column wires 808, 810, 812, 814, then currents are read and accumulated from row wires 802, 804, 806. For weight updates, which are described in greater detail below, voltages are applied to column wires and row wires at the same time, and the conductance values stored in the relevant RPU devices all update in parallel. Accordingly, the multiplication and addition operations required to perform weight updates are performed locally at each RPU 820 of array 800 using the RPU device itself plus the relevant row or column wire of array 800.

Continuing with the diagram of FIG. 6, in accordance with one or more embodiments, the operation of a positive weight update methodology for RPU 820 and its corresponding weight $\sigma_{33}$ at the intersection of conductive row wire 806 and conductive column wire 812 will now be provided. Update generator circuitry (not shown) is provided at the periphery of crossbar array 800 and used as a peripheral "translator" in order to generate necessary voltage pulses in the form of stochastic bit streams that are applied to all RPUs of 2D crossbar array 800.

Accordingly, referring to the ANN implemented using a crossbar array including RPUs as described herein, in the array, the value of the resistance (or conductance) of each node determines the coupling between nodes, where a node is represented by an RPU device in the array. Further, upon training the crossbar array according to the ANN, the resistance (or conductance) will be different from device to device, depending on the desired coupling. For training a neural network, it is necessary to actively adjust the resistance values. Once the training is complete, the resistance values remain fixed during the operation of the crosspoint array circuit, until training begins for a new task.

Figure 7:
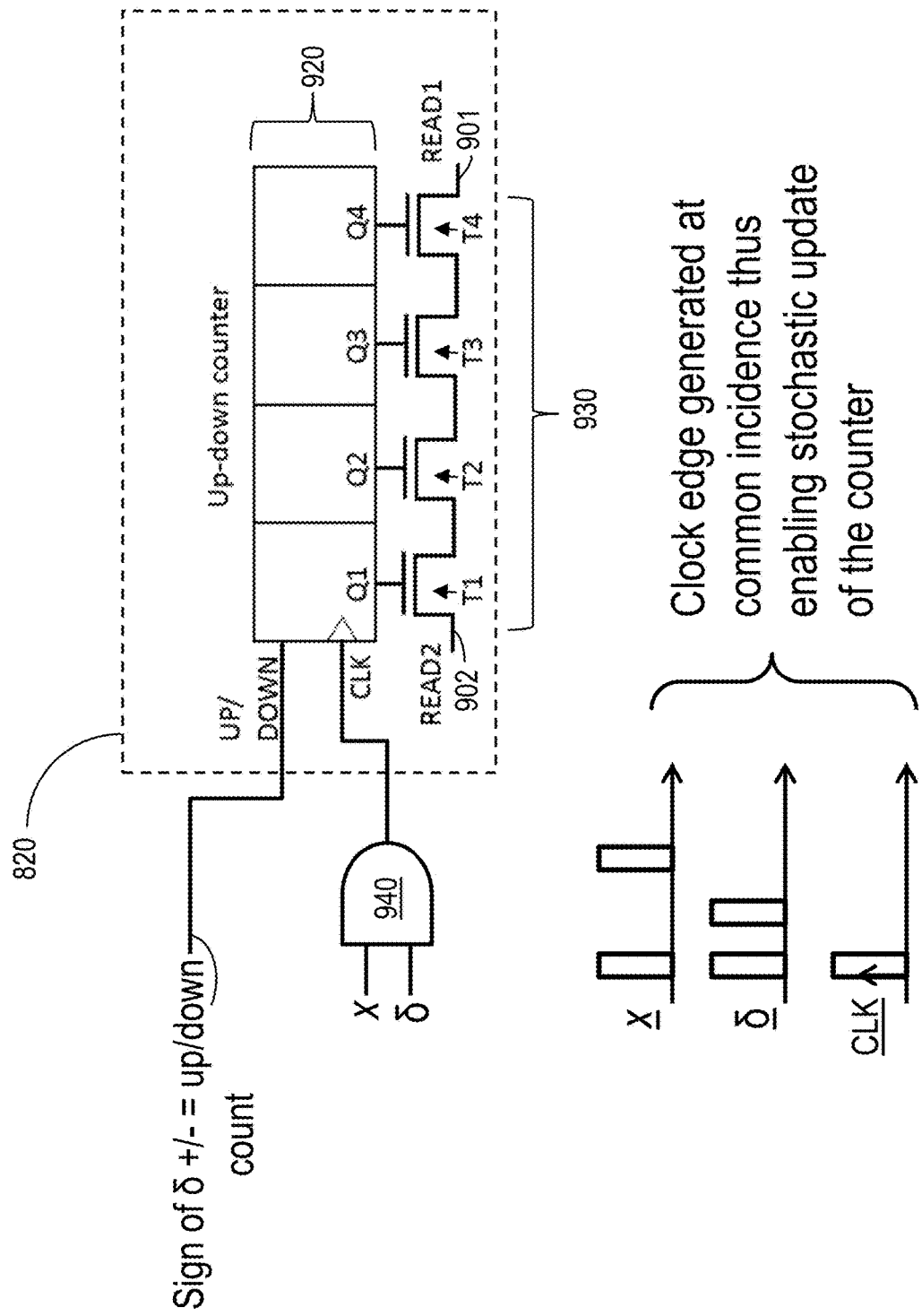
FIG. 7 depicts a counter-based RPU that can be used as a crosspoint device in an RPU array according to one or more embodiments.

FIG. 7 depicts a counter-based RPU that can be used as a crosspoint device in an RPU array according to one or more embodiments. The RPU device 820 includes a pair of terminals 901, 902, which connect the RPU 820 to the crosspoint array 800.

Further, the counter-based RPU 820 includes a counter 920, which is a set of single bit counters, and resistor device 930, which is a stack of resistive circuits. In the depicted counter-based RPU, the resistive device includes transistors T1, T2, T3, and T4 as the resistive circuits. The transistors can be field-effect transistors (FETs) or any other type of transistors. However, in other embodiments, the resistive device 930 includes other types of resistive circuits, such as a resistor ladder (FIG. 12) or any other type of circuits that can be stacked together to provide the adjustable/controllable resistance/conductance as provided by the technical solutions described herein.

The first set of conductive wires in the RPU array 800 is coupled with the READ1 901 and READ2 902 terminals of the crosspoint device 820 for reading the weight values stored in the crosspoint device 820 (as opposed to updating the weight values). The second set of conductive wires in the RPU array 800 is coupled with the logic gate 940 and the UP/DOWN counter 920 of the RPU device 820. Particularly, the second set of wires connect, (a) to the logic-gate inputs of the device, in turn generating the clock pulse under common incidence, and (b) connect to the counter UP/DOWN input to adjust the counter according to the weight value to be stored. The voltages used for the second set of wires are selected for the correct logical operation of the logic-gate 940 (e.g., AND gate) and the counter 920 (typically, 0 and VDD). Furthermore, each column wire in the second set includes two wires: one carrying the voltage pulse proportional to the error value ($\delta$) of the subsequent layer-neuron, and the second carrying the corresponding sign of the error value (e.g., 0V=− sign, VDD=+sign) to cause the increment/decrement at the clock pulse.

As mentioned earlier, forward/backward propagation happens using the first set of column and row wires, and the weight update happens through a second, distinct set of wires (rows and columns). During forward and backward propagation the voltage pulses are applied to wires in the first set of wires which are optimized for current accumulation operation (i.e., the voltage values are chosen such that if the crosspoint device is based on the FET-resistor stack, those FETs operate in the linear-regime (as opposed to saturation-regime)). On the other hand, during the update phase, the second set of wires in the crossbar array 800 is used.

Each of the single bit counters from the counter 920 corresponds to a respective resistive circuit from the resistor device 930. It should be noted that in the example depicted in FIG. 7, the counter 920 includes four bits mapped respectively with a stack of four resistive circuits from the resistor device 930. However, in other examples, the RPU can include a different number of single counter bits and resistive circuits than those depicted herein.

The resistance/conductance provided by the resistor device 930 affects the current output by the RPU 820 based at least in part on the voltage applied to the crosspoint. In one or more examples, the stack of resistive circuits includes the resistive circuits being connected in series. Therefore, the resistance of the resistor device 930 is a sum of the resistance of each of the resistive circuits that is activated. A resistive circuit from the resistor device 930 is activated based at least in part on a state of the corresponding single bit counter from the counter 920. For example, if a single bit counter is set (=1/ON), the corresponding resistive circuit is activated, and if the single bit counter is not set (=0/OFF), the corresponding resistive circuit is not activated; or vice versa.

Further, in order to create a series of resistive states, the resistive circuits from the resistor device 930 have specific constraints. For example, the resistive circuits have quadratically increasing resistance as depicted in TABLE 1, where each successive resistive circuit has a resistance/conductance that is twice that of a previous resistive circuit in the stack. It should be noted that in other examples, the resistive circuits can have a different predetermined relationship than the example herein.

TABLE 1

| FET | Resistance |
|---|---|
| T1 | 1× |
| T2 | 2× |
| T3 | 4× |
| T4 | 8× |

Figure 8:
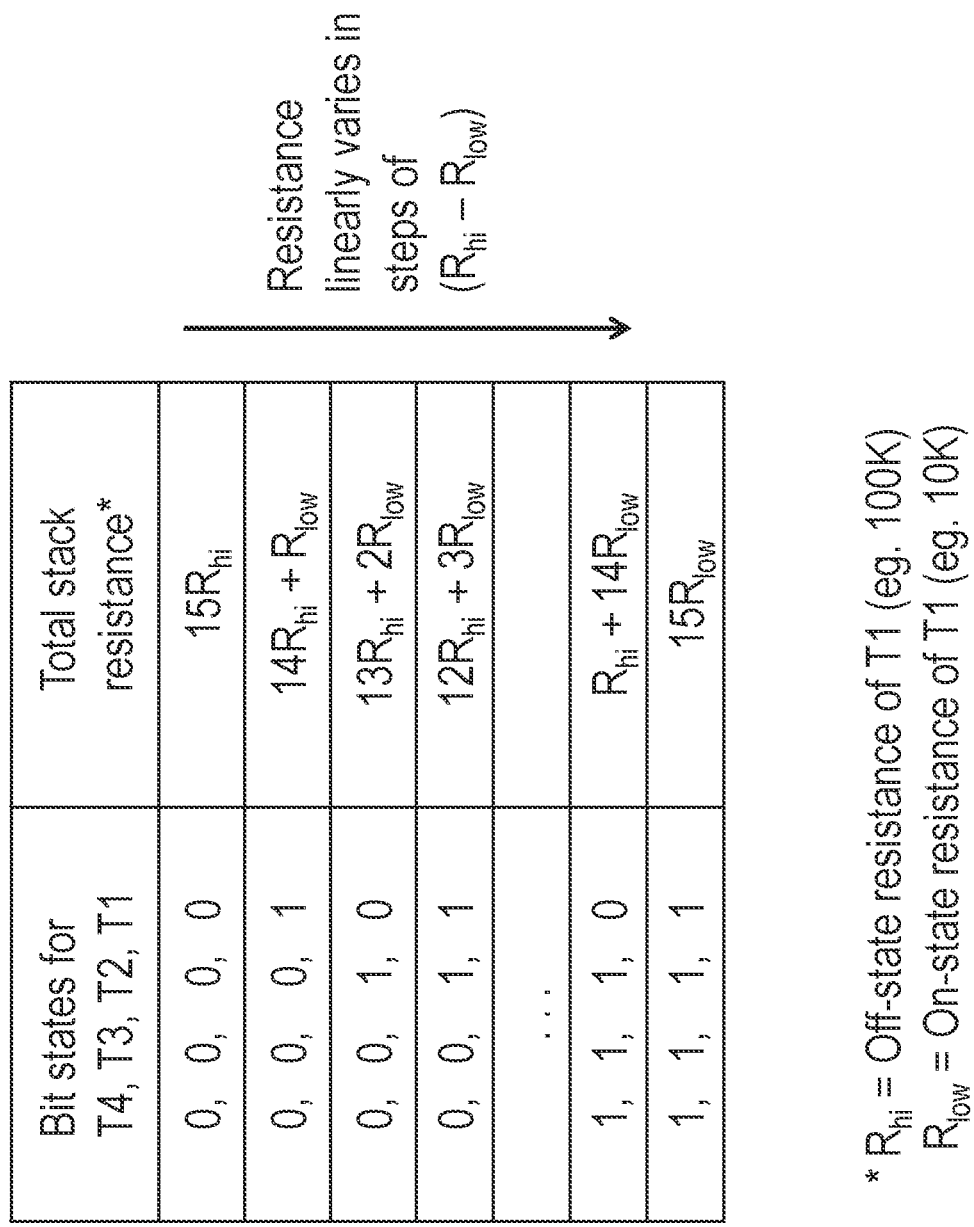
FIG. 8 depicts adjustable resistance of the resistor device based at least in part on the states of the counter according to one or more embodiments.

FIG. 8 depicts adjustable resistance of the resistor device based at least in part on the states of the counter according to one or more embodiments. Consider that $R1_{hi}$=Off-state resistance of T1 (e.g., 100K Ω) and $R1_{low}$=On-state resistance of T1 (e.g., 10K Ω). The resistances of the other resistive circuits T2, T3, and T4, can be determined based at least in part on the relationship between the resistive circuits, for example, the quadratic relationship (Table 1). Thus, $R2_{hi}=2R1_{hi}$; $R3_{hi}=4R1_{hi}$; and $R4_{hi}=8R1_{hi}$. Accordingly, if the counter 920 is set to 1, that is, only T1 is set to ON, the total resistance of the resistor device 930 is $R1_{low}+R2_{hi}+R3_{hi}+R4_{hi}=14R1_{hi}+R1_{low}$. Other configurations of varying the resistance of the resistor device 930 according to the value stored in the counter 920 are depicted in FIG. 8. The resistance of the resistor device 930 thus linearly varies in steps of $(R_{hi}-R_{low})$.

It should be noted that the relationship between the resistive circuits of the resistor device 930 can be varied to vary the linear step by which the resistor device 930 is adjusted according to the counter value 920. For example, if the resistive circuits used in the resistor device are FETs, the relationship can be achieved by various combinations of width, length, threshold voltage (Vt), and/or bias voltage, of the FETs.

Figure 9:
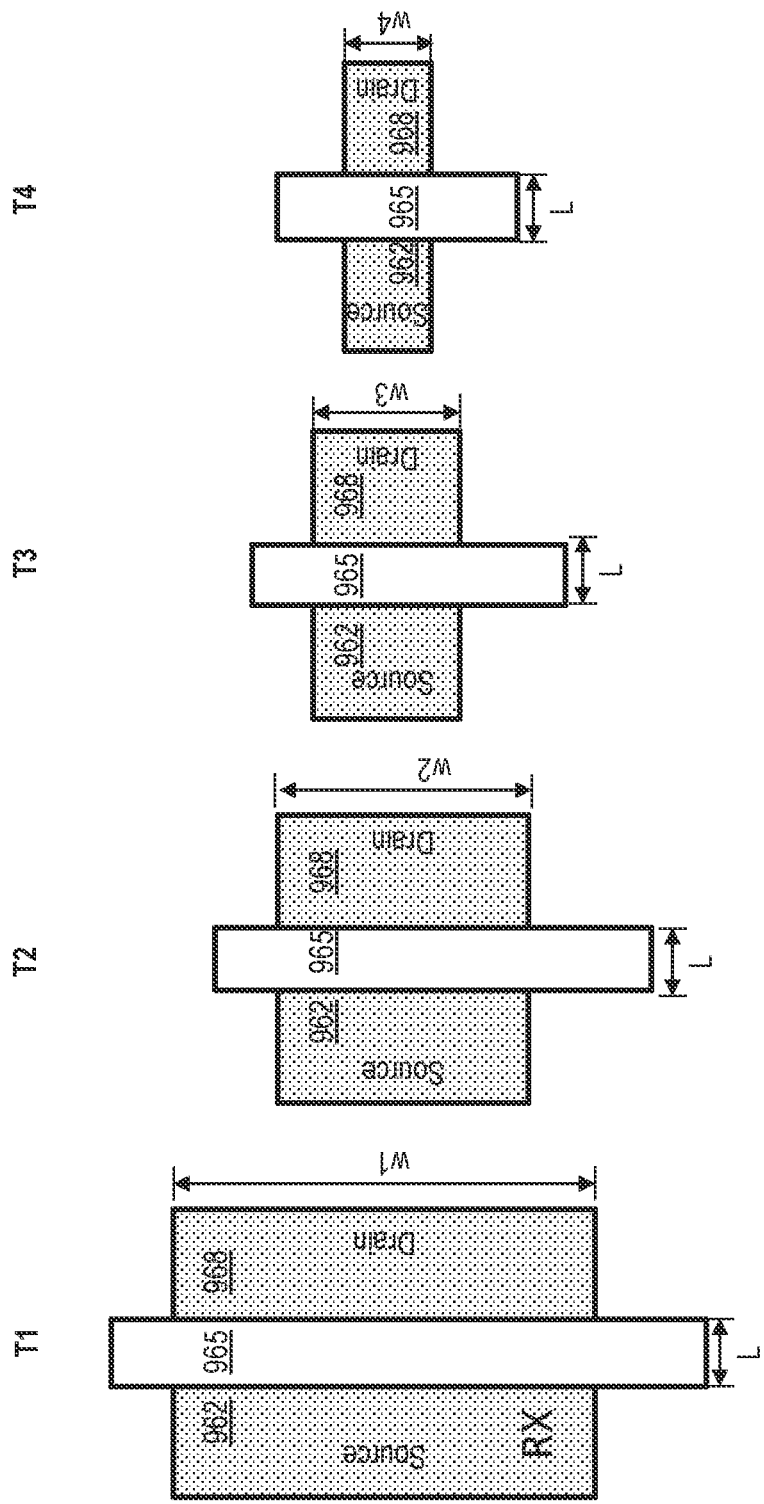
FIG. 9 depicts varying the resistance/conductance of FETs based at least in part on the width according to one or more embodiments.

FIG. 9 depicts varying the resistance/conductance of FETs based at least in part on the width according to one or more embodiments. The FETs T1, T2, T3, and T4, have source 962 and drain 968 of varying widths w1, w2, w3, and w4, respectively with gate 965 having substantially the same gate length L. The widths w1, w2, w3, and w4, are varied according to the relationship to vary the resistance/conductance of the resistor device 930. For example, the width w1 is twice that of w2, w2 is twice of w3, and w3 is twice of w4, where w4 is a predetermined transistor width assigned to T4. In one or more examples, the width is varied by changing the number of fins in case the FETs used as the resistive circuits are FinFETs. For example, table 2 depicts a 4-bit example of varying the resistance/conductance of the resistive circuits from the resistor device 930 by varying the number of fins of the FinFETs used as the resistive circuits.

TABLE 2

| FET | # FINs | Resistance |
|---|---|---|
| T1 | 8 | 1× |
| T2 | 4 | 2× |
| T3 | 2 | 4× |
| T4 | 1 | 8× |

Figure 10:
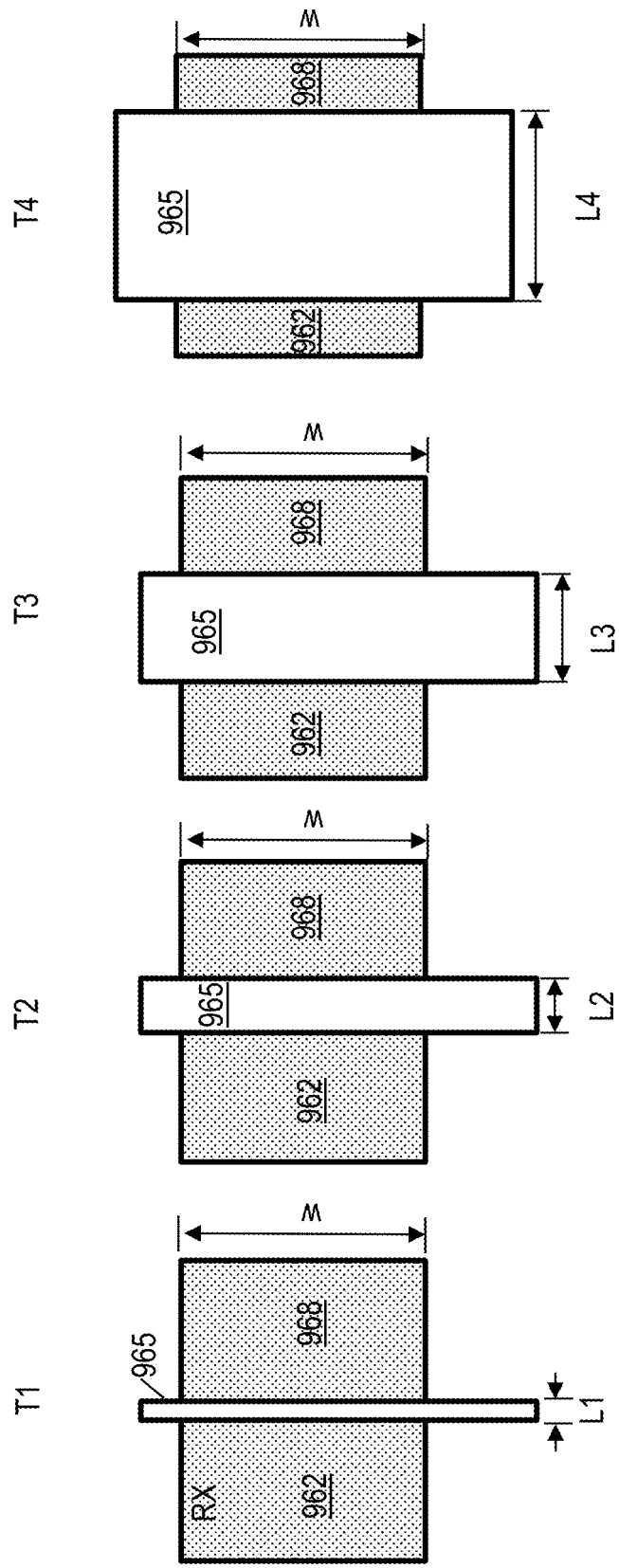
FIG. 10 depicts varying the resistance/conductance of FETs based at least in part on the gate length according to one or more embodiments.

FIG. 10 depicts varying the resistance/conductance of FETs based at least in part on the gate length according to one or more embodiments. In this case, the FETs T1, T2, T3, and T4, have source 962 and drain 968 of a common width w, and gates 965 having different gate lengths L1, L2, L3, and L4, respectively. The lengths L1, L2, L3, and L4, are varied according to the relationship to vary the resistance/conductance of the resistor device 930. For example, the length L4 is twice that of L3, L3 is twice of L2, and L2 is twice of L1, where L1 is a predetermined transistor gate length assigned to L1.

Figure 11:
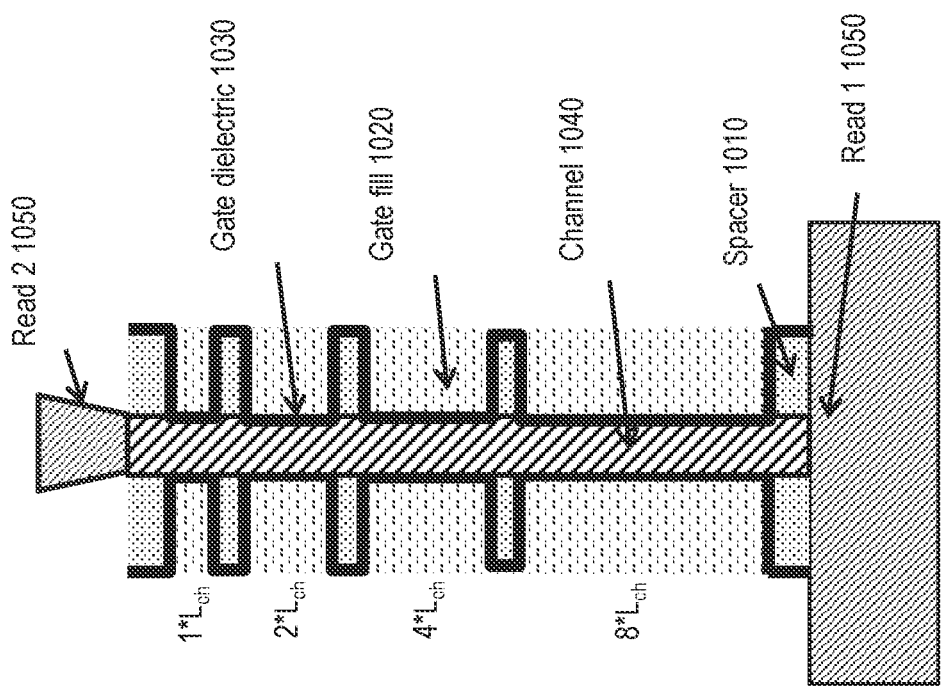
FIG. 11 depicts an example of the resistor device 930 with variable resistance/conductance using vertical geometry according to one or more embodiments.

FIG. 11 depicts an example of the resistor device 930 with variable resistance/conductance using vertical geometry according to one or more embodiments. Here, the stack FETs are fabricated in a vertical geometry. The fabrication is performed on a substrate layer. In the exemplary embodiment, the substrate can be a silicon-on-insulator wafer that includes a top layer or silicon layer on top of an insulating layer such as a BOX (buried oxide) layer that can include silicon-dioxide. The substrate layer can be an N+ silicon substrate layer or any other such material.

A spacer layer 1010 is used to separate the various FETs in the stack by depositing the spacer layer 1010 between gate fill layers 1020 for the gates of the various FETs. For example, the spacer 1010 can be a SiNx layer and The gate fill 1020 can be composed of any type of electrically conductive material such as those selected from the group consisting of aluminum, cobalt, copper, gold, hafnium, nickel, palladium, platinum, molybdenum, niobium, polysilicon, rhodium, silver, tantalum, tantalum nitride, tin, titanium nitride, titanium tungsten, tungsten, vanadium, zirconium, an electrically conductive polymer, and mixtures thereof.

Further, a gate dielectric 1030 is used to separate the gate fill layer 1020 from the spacer as well as from a transistor channel 1040. The gate-dielectric 1030 can be composed of any known dielectric material such as those selected from the group consisting of aluminum arsenide, aluminum gallium arsenide, aluminum nitride, aluminum oxide, barium fluoride, barium strontium titanium oxide, barium titanium oxide, calcium fluoride, cerium fluoride, cerium oxide, gallium arsenide, hafnium aluminate, hafnium oxide, hafnium oxynitride, hafnium silicon oxide, hafnium silicon oxynitride, indium oxide, indium gallium nitride, indium phosphide, lanthanum oxide, lanthanum aluminum oxide, lanthanum silicon oxides, lead scandium tantalum oxide, lead zinc niobate, magnesium fluoride, niobium fluoride, niobium oxide, silicon nitride, silicon oxide, strontium bismuth tantalite, strontium titanium oxide, zirconium oxide, zirconium silicon oxide, titanium oxide, titanium dioxide, tantalum dioxide, tantalum pentoxide, tin oxide, zirconium aluminate, zirconium oxide, zirconium oxynitride, zirconium silicon oxynitride, yttrium oxide, yttrium silicon oxides, and admixtures thereof. In at least one example, the gate-dielectric 90 exhibits a dielectric constant greater than that of silicon oxide.

A gate channel 1040 can be doped to provide particular electrical and performance characteristics. In one or more examples, the channel 1040 can be a polysilicon material surrounded by the gate electrodes 1020. Further yet, the vertical FET stack includes the terminals 1050 that provide the Read-1 901 and Read-2 902 terminals for the resistor device 930.

The gate dielectric 1020 deposition is spaced according to the varied lengths of the gates for the FETs T1, T2, T3, and T4, to create the quadratic (or any other predetermined) relationship between the gate lengths, and hence the resistance/conductance. Thus, the resistor device 930 can be a vertical FET stack with varying gate lengths.

Referring back to FIG. 7, the counter 920 is updated to store the weight at the crosspoint of the RPU array 800 at a clock edge that is generated at a common incidence of x and δ, thus enabling stochastic update of the counter 920. The x and δ are the voltages that are applied to the rows and columns of the RPU array 800 and include stochastic sequences of the voltages. The x corresponds to the stochastic pulse signal generated by the input to the crosspoint device. In one or more examples, x is a stochastic sequence based on the feed-forward output of a given layer, and the δ is a stochastic sequence generated based on the error computed by the subsequent layer of the crossbar array of RPU devices 820.

Accordingly, when both stochastic sequences x and δ have a common waveform, a clock edge is generated and provided to the counter by a logic gate 940. In one or more examples, the logic gate 940 is an AND gate that receives the x and δ sequences as input and provides the clock (CLK) as output. Other logic gates can be used in other examples.

The counter 920 receives, in addition to the CLK as an input, a second input that is indicative of a sign of the δ. Based on the sign, the counter 920 either increments (sign=+) or decrements (sign=−) the count value stored in the counter 920. Based on the increment/decrement, the bits in the single bit counters of the counter 920 change and in turn, the resistive circuits of the resistor device 930 are activated/deactivated to adjust the resistance/conductance of the resistor device 930.

Figure 12:
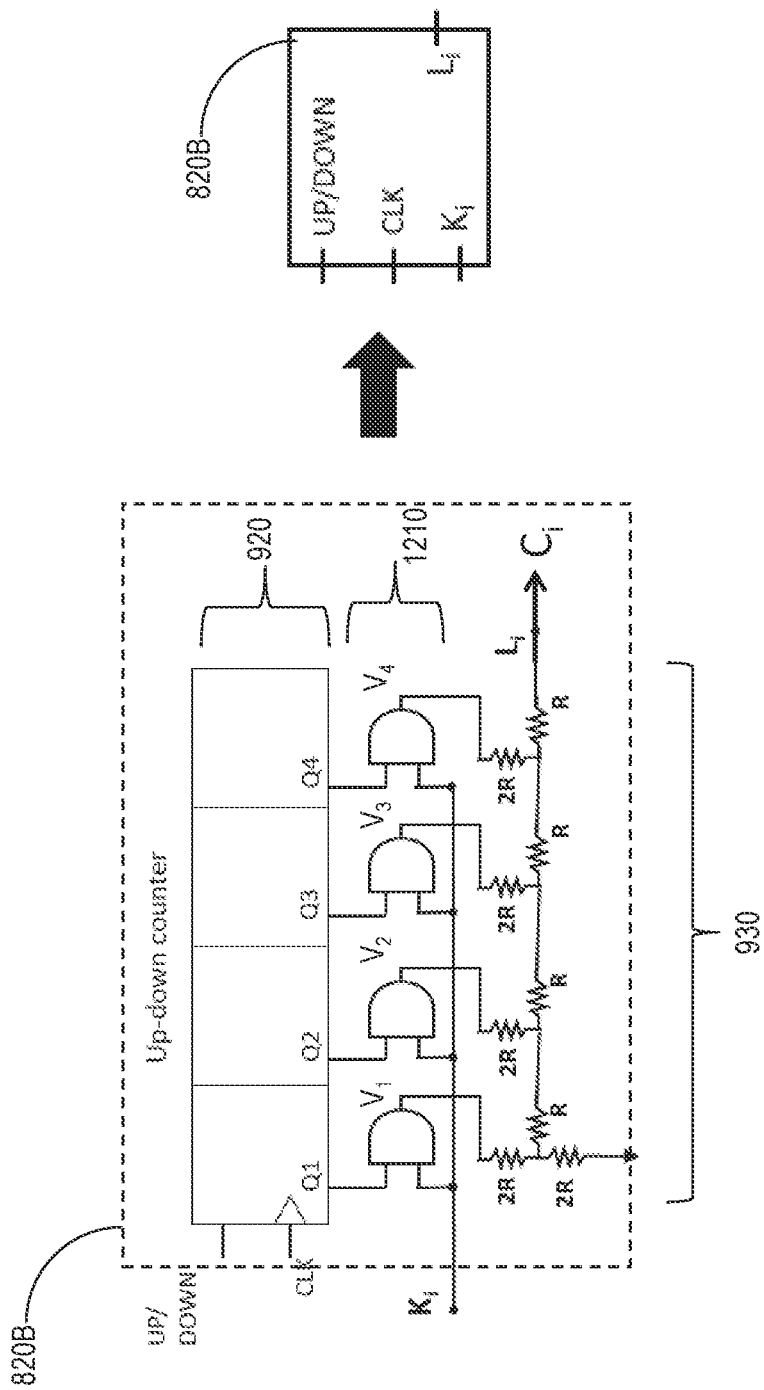
FIG. 12 depicts a counter-based RPU that can be used as a crosspoint device in an RPU array according to one or more embodiments.

FIG. 12 depicts a counter-based RPU that can be used as a crosspoint device in an RPU array according to one or more embodiments. Here, the RPU 820B, compared to the RPU 820 with a stack of FETs used in the resistor device 930 (FIG. 7), uses a resistor device 930 that includes a resistor ladder as the transduction element. In the example depicted, a 4-bit resistor ladder is shown, however, it should be noted that in other examples a different number of resistive circuits can be used in the resistor ladder to support a different number of bits in the counter 920. The resistor ladder shown includes four resistive circuits associated with corresponding single bit counters respectively of the counter 920.

Here, when input Ki is pulsed high, the current flowing out from the ladder circuit Ci is proportional to the value (i.e., weight) of the counter 920 (represented by the single bit counters <Q1: Q4>). Subsequently, during forward propagation the output currents are accumulated column-wise by the RPU array 800. Further, during back propagation, the output currents are accumulated row-wise by the RPU array 800.

For the 4-bit example depicted, consider that the voltages at the output nodes of the AND gates 1210 are <V1: V4> (either VL=0V or VH=1V, for example). The current flowing out from the circuit Ci into the column of the RPU array 800 is:

$$C_i = \frac{1}{2R}\left(\frac{1}{2^3}V_1 + \frac{1}{2^2}V_2 + \frac{1}{2^1}V_3 + \frac{1}{2^0}V_4\right)$$

More generally, for the case of r-bits, current flowing out is:

$$C_i = \frac{1}{2R}\left(\frac{1}{2^{r-1}}V_1 + \frac{1}{2^{r-2}}V_2 + \ldots + \frac{1}{2^1}V_{r-1} + \frac{1}{2^0}V_r\right)$$

Thus, the current is proportional to the digital value of the counter as exemplified in Table 3 for the 4-bit case, where the current varies linearly in steps of $\frac{1}{16}R$, where R is a predetermined resistance value.

TABLE 3

| Bit states for V4, V3, V2, V1 | Current flowing out, $C_i$ |
|---|---|
| 0, 0, 0, 0 | 0 |
| 0, 0, 0, 1 | 1/16R |
| 0, 0, 1, 0 | 2/16R |
| 0, 0, 1, 1 | 3/16R |
| . . . | . . . |
| 1, 1, 1, 0 | 14/16R |
| 1, 1, 1, 1 | 15/16R |

Figure 13:
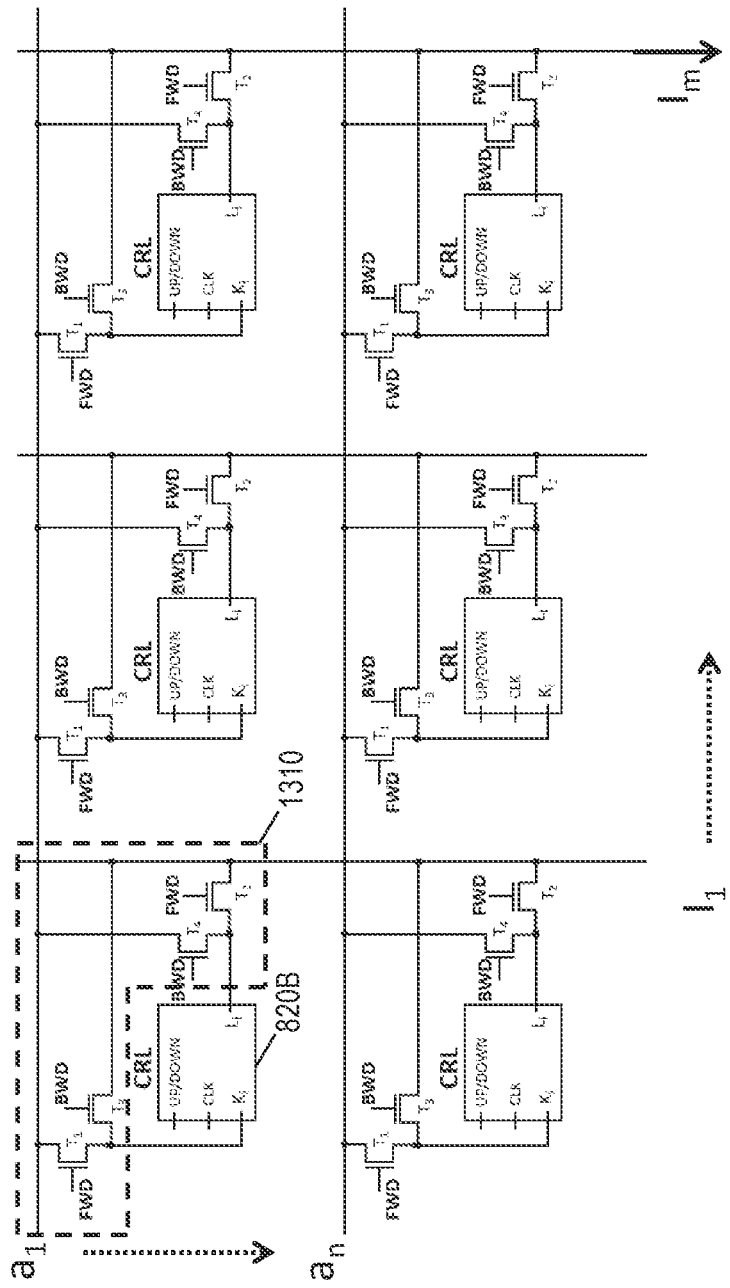
FIG. 13 depicts how the counter-based RPU 820B with resistor ladder is connected as a crosspoint device in the RPU array 800 according to one or more embodiments.

FIG. 13 depicts how the counter-based RPU 820B with resistor ladder is connected as a crosspoint device in the RPU array 800 according to one or more embodiments. Connecting the RPU 820B in the RPU array 800 uses a connection circuit 1310. The connection circuit 1310 includes four transistors Tr1 1312, Tr2 1314, Tr3 1316, and Tr4 1318, as depicted and described further. The transistors Tr2 and Tr4 have resistances <<$R/2^r$ where r=number of bits used in the counter 920.

Figure 14:
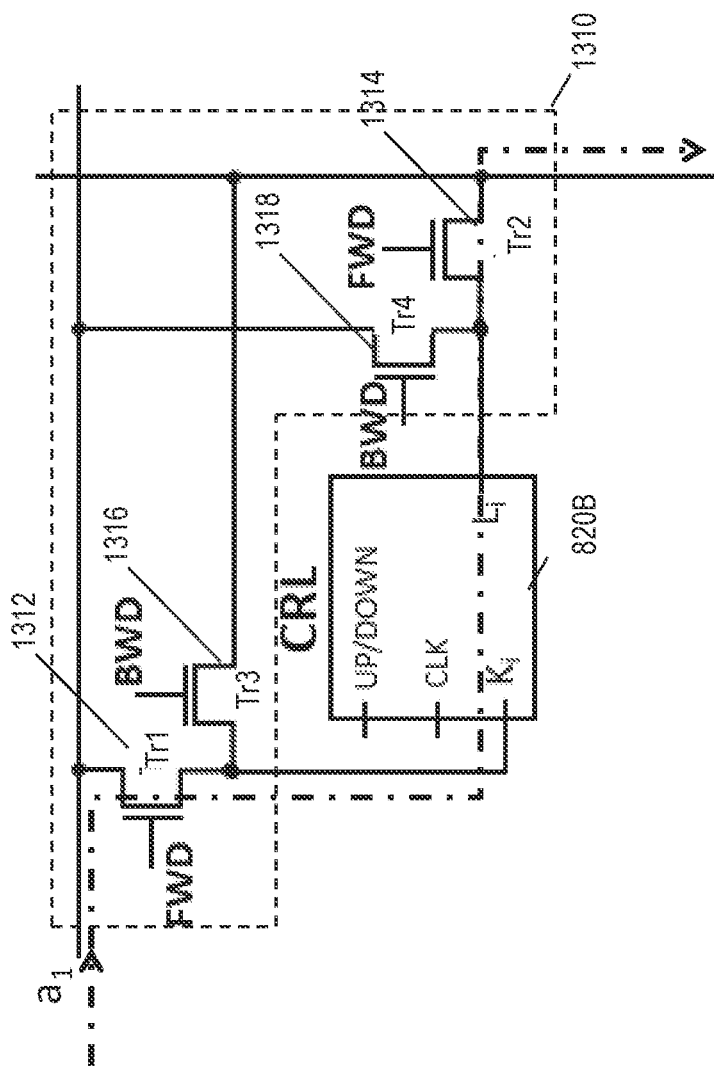
FIG. 14 depicts a forward propagation pass performed using the RPU 820B and the connection circuit 1310 according to one or more embodiments.

FIG. 14 depicts a forward propagation pass performed using the RPU 820B and the connection circuit 1310 according to one or more embodiments. During forward propagation, the two FWD transistors (Tr1 1312 and Tr2 1314) at each crosspoint are turned ON, and the two BWD transistors (Tr3 1316 and Tr4 1318) are turned OFF.

Figure 15:
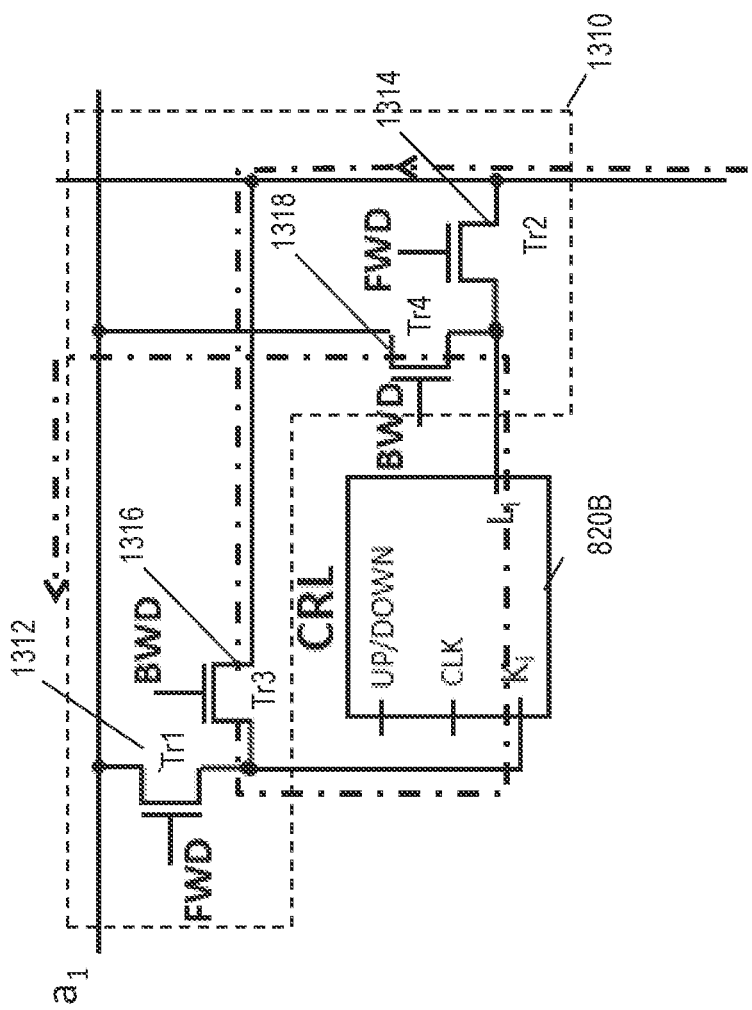
FIG. 15 depicts a backward propagation pass performed using the RPU 820B and the connection circuit 1310 according to one or more embodiments.

FIG. 15 depicts a backward propagation pass performed using the RPU 820B and the connection circuit 1310 according to one or more embodiments. During back propagation, two FWD transistors (Tr1 1312 and Tr2 1314) at each crosspoint are turned OFF, and the two BWD transistors (Tr3 1316 and Tr4 1318) are turned ON.

In both the forward and backward propagation, using the RPU 820B, the operation of the RPU array 800 continues as described earlier, with current accumulated column-wise for the forward propagation and row-wise for the backward propagation.

Figure 16:
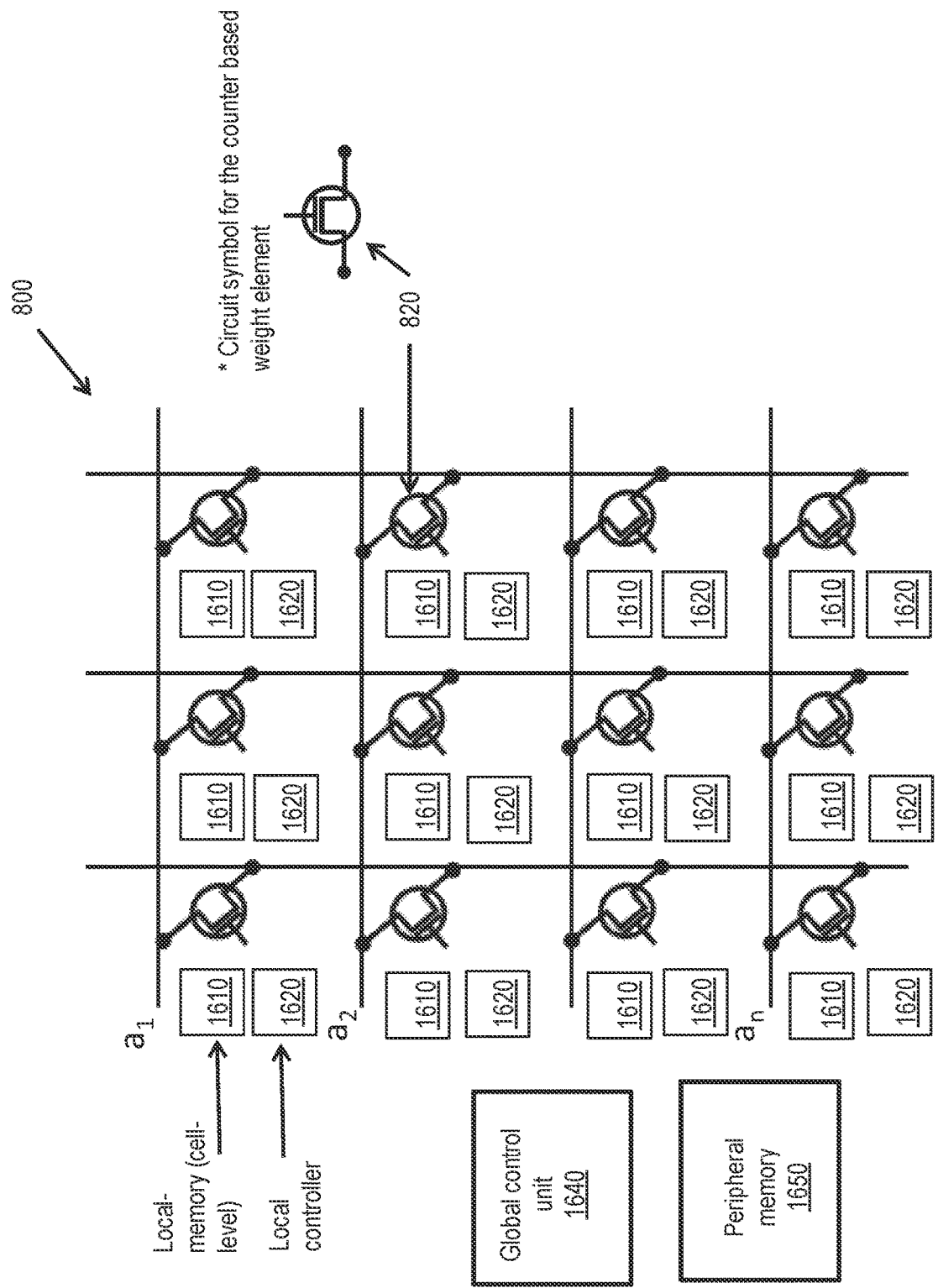
FIG. 16 depicts an RPU array using the counter-based RPU devices according to one or more embodiments.

FIG. 16 depicts an RPU array using the counter-based RPU devices according to one or more embodiments. The RPU array 800 includes the counter-based RPUs 820 at each crosspoint. The RPU devices 820 can use the FET-based or the resistor-ladder-based resistor device 930 as described herein. The RPU array 800 further includes, at each crosspoint, a local memory 1610 and a local controller 1620.

The local memory 1610 at a specific crosspoint stores multiple weights assigned to the specific crosspoint by each of the one or more ANN matrices, each matrix corresponding to the connection between two adjacent layers of the ANN (For example, matrix1 connects Layer-A to Layer-B, and matrix2 connects Layer-B to Layer-C, and so forth). The local controller 1620 receives an instruction from a global controller 1640 to load the corresponding weights into the RPU devices 820 based on the layers of the ANN being processed. Accordingly, the local controller 1620 accesses the corresponding weight value from the local memory 1610 and loads the weight value into the counter 920 of the RPU device 820 at the specific crosspoint.

Further, the global controller 1640 instructs the local controller 1620 of a change in the counter value after a weight update operation. In one or more examples, in response, the local controller 1620 reads the updated weight value from the counter 920 and stores the updated value into the local memory 1610 for subsequent use.

In one or more examples, a peripheral memory 1650 stores information used by the global controller 1640, for example, parameter values indicative of the processing of the ANN, such as which layer is being processed, among others.

Figure 17:
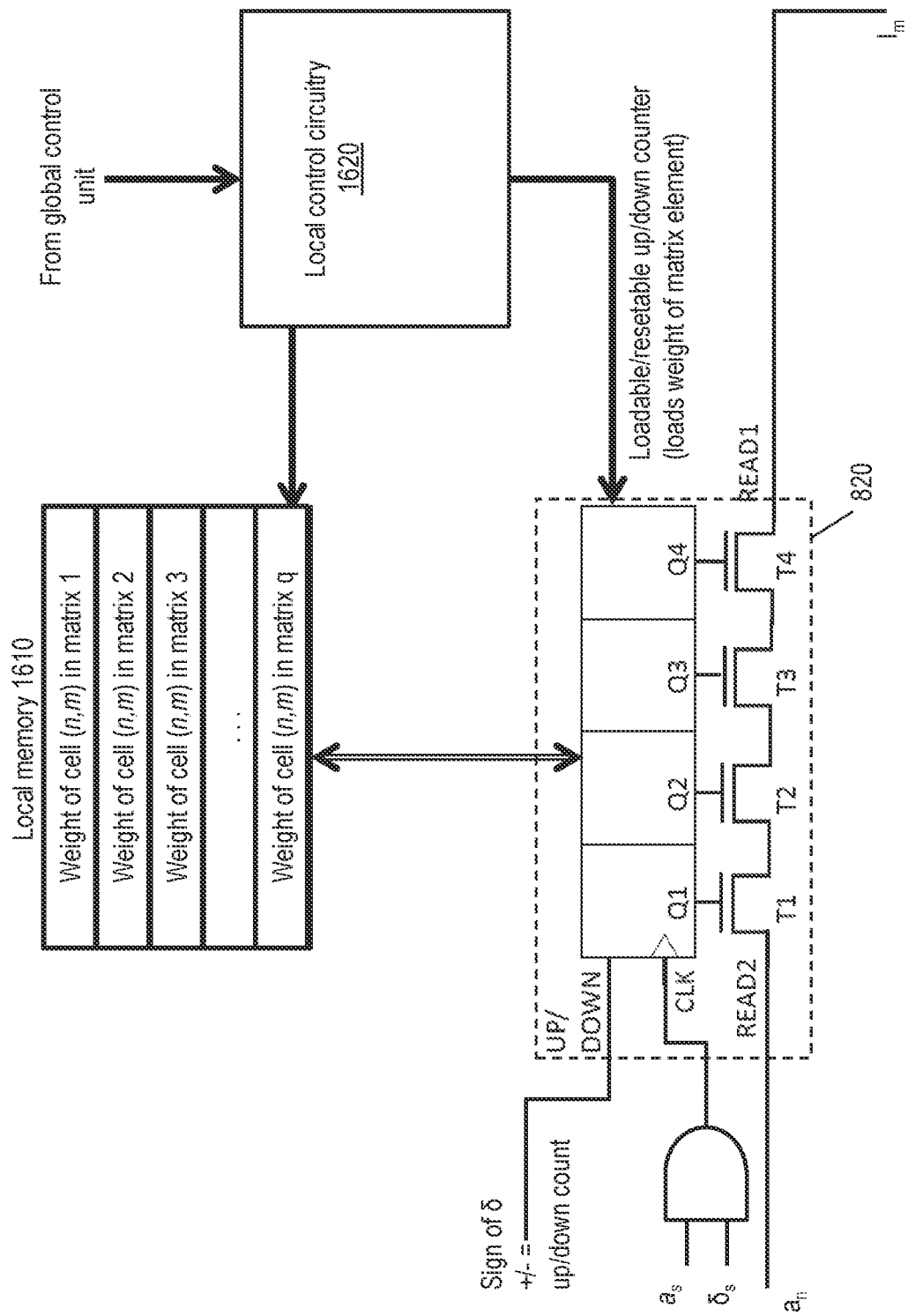
FIG. 17 depicts a dataflow in an RPU array using the counter-based RPU devices according to one or more embodiments.

FIG. 17 depicts a dataflow in an RPU array using the counter-based RPU devices according to one or more embodiments. The RPU array 800 includes the counter-based RPUs 820 at each crosspoint. The RPU devices 820 can use the FET-based or the resistor-ladder-based resistor device 930 as described herein. The weight elements of the individual cells of the RPU array 800 are stored locally at the cell-level in the local memory 1610 for efficient data transfer. All the different weights that can be assigned to a particular cell (e.g., crosspoint (m, n)) of each ANN weight matrix (e.g., matrix1 between A-B layers, matrix2 between B-C layers, etc.) is stored in the local memory 1610. The weight is loaded into the cell during respective layer operations (i.e., forward propagation, back propagation, and weight update). Further, the value of the cell is stored back into the local memory 1610 after the weight update step.

As depicted, the local controller 1620 receives an indication/instruction from the global controller 1640 that a particular layer (e.g., A-B) is being processed. Accordingly, the local controller 1620 for a specific crosspoint (m, n) reads the weight value for the cell (m, n) that is stored in the local memory 1610, and updates the counter 920 of the RPU device 820 at the crosspoint (m, n) of the RPU array 800. As described herein, the counter value adjusts the resistance/conductance of the resistor device 930 of the RPU device 820 at the crosspoint (m, n). Accordingly, when a voltage sequence ($a_n$) is applied to the RPU array 800 at the row n, the RPU device 820 passes a current $I_m$ as output based at least in part on the adjusted resistance/conductance according to the counter value. The currents across the multiple RPU devices 820 in the column are accumulated in forward propagation to provide input value to the subsequent layer. Alternatively, in backward propagation, the current is accumulated across the rows.

Thus, the RPU array 800 facilitates implementing multiple layers of an ANN using adjustable resistance/conductance of the RPU device 820, the resistance/conductance being adjustable using a counter 920 that activates/deactivates corresponding resistive circuits in the resistor device 930 of the RPU device 820.

The technical solutions described herein improve typical weight storage elements used in RPU arrays by eliminating charge-loss, and stringent requirements on update currents, which are typically observed when using capacitor-based weight storage elements. The technical solutions described herein facilitate using a counter-based RPU device as the weight storage element where the counter bits control gate terminals of FETs connected in a series such that the total resistance of the FET stack is used as the transduction element (i.e., resistor element of each RPU cell). Alternatively, the technical solutions described herein facilitate using a counter-based RPU device in which a resistor ladder is used as the transduction element based at least in part on the counter bits.

The present technical solutions may be a system, a method, and/or a computer program product at any possible technical detail level of integration. The computer program product may include a computer readable storage medium (or media) having computer readable program instructions thereon for causing a processor to carry out aspects of the present technical solutions.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may include copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present technical solutions may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present technical solutions.

Aspects of the present technical solutions are described herein with reference to flowchart illustrations and/or block diagrams of methods, apparatus (systems), and computer program products according to embodiments of the technical solutions. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present technical solutions. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

A second action may be said to be "in response to" a first action independent of whether the second action results directly or indirectly from the first action. The second action may occur at a substantially later time than the first action and still be in response to the first action. Similarly, the second action may be said to be in response to the first action even if intervening actions take place between the first action and the second action, and even if one or more of the intervening actions directly cause the second action to be performed. For example, a second action may be in response to a first action if the first action sets a flag and a third action later initiates the second action whenever the flag is set.

To clarify the use of and to hereby provide notice to the public, the phrases "at least one of <A>, <B>, . . . and <N>" or "at least one of <A>, <B>, . . . <N>, or combinations thereof" or "<A>, <B>, . . . and/or <N>" are to be construed in the broadest sense, superseding any other implied definitions hereinbefore or hereinafter unless expressly asserted to the contrary, to mean one or more elements selected from the group comprising A, B, . . . and N. In other words, the phrases mean any combination of one or more of the elements A, B, . . . or N including any one element alone or the one element in combination with one or more of the other elements which may also include, in combination, additional elements not listed.

It will also be appreciated that any module, unit, component, server, computer, terminal or device exemplified herein that executes instructions may include or otherwise have access to computer readable media such as storage media, computer storage media, or data storage devices (removable and/or non-removable) such as, for example, magnetic disks, optical disks, or tape. Computer storage media may include volatile and nonvolatile, removable and non-removable media implemented in any method or technology for storage of information, such as computer readable instructions, data structures, program modules, or other data. Such computer storage media may be part of the device or accessible or connectable thereto. Any application or module herein described may be implemented using computer readable/executable instructions that may be stored or otherwise held by such computer readable media.

The descriptions of the various embodiments of the present technical solutions have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application, or technical improvement over technologies found in the marketplace, or to enable others of ordinary skill in the art to understand the embodiments described herein.

What is claimed is:

1. A method for implementing a neural network, the method comprising:
   selecting, by a global controller, a matrix to be loaded in a crosspoint array, the matrix corresponding to a connection between two layers of the neural network;
   in response, loading, by a local controller at a crosspoint in the crosspoint array, a weight value in a crosspoint device associated with the crosspoint, the weight value assigned to the crosspoint for the selected matrix; and
   in response, adjusting, by the crosspoint device, a conductance of a resistor device associated with the crosspoint, the conductance corresponding to the weight value loaded into the crosspoint device;
   wherein the crosspoint device comprises:
      a counter comprising a plurality of single bit counters, states of the single bit counters representing the weight to be stored at the crosspoint device; and
      a resistor device comprising a plurality of resistive circuits, each resistive circuit associated with a respective single bit counter from the plurality of single bit counters, the resistive circuits activated or deactivated according to a state of the associated single bit counter.

2. The method of claim 1, wherein an electrical conductance of the resistor device is adjusted based at least in part on the resistive circuits that are activated.

3. The method of claim 1, wherein the global controller is configured to adjust values stored at each crosspoint device in the crosspoint array.

4. The method of claim 1, wherein the method further comprises reading, from a local memory, a current state of each single bit counter of a plurality of single bit counters in the crosspoint device.

5. The method of claim 4, wherein the method further comprises updating the local memory to indicate an updated state of each single bit counter of the plurality of single bit counters.

6. The method of claim 1, wherein the plurality of resistive circuits in the resistor device of the crosspoint device include a quadratically increasing resistance, a first resistive circuit having a predetermined resistance and each further successive resistive circuit having a resistance that is twice of a previous resistive circuit.

7. The method of claim 1, wherein the plurality of resistive circuits are field effect transistors (FETs).

8. The method of claim 1, wherein the plurality of resistive circuits are a resistor ladder, each of the resistive circuit comprising:
   a logic gate; and
   a series of resistors; and
   wherein, the logic gate is activated based at least in part on the state of the corresponding single bit counter.

* * * * *